(12) United States Patent
Chandrakumar et al.

(10) Patent No.: US 6,504,367 B1
(45) Date of Patent: *Jan. 7, 2003

(54) ELECTRONIC PARAMAGNETIC RESONANCE IMAGING DEVICE USING HIGH AMPLITUDE MODULATOR

(75) Inventors: Narayanan Chandrakumar, Chennai (IN); Kassey Victor Babu, Chennai (IN); Visalakshi Vijayaragavan, Chennai (IN)

(73) Assignee: Council of Scientific and Industrial Research, New Delhi (IN)

( * ) Notice: Subject to any disclaimer, the term of this patent is extended or adjusted under 35 U.S.C. 154(b) by 0 days.

This patent is subject to a terminal disclaimer.

(21) Appl. No.: 09/695,225

(22) Filed: Oct. 25, 2000

(30) Foreign Application Priority Data

Sep. 1, 2000 (IN) .................................. IP792/DEL/2000

(51) Int. Cl.[7] ................................................ G01V 3/00
(52) U.S. Cl. ........................ 324/307; 324/300; 324/318
(58) Field of Search .............................. 324/300, 307, 324/318, 322, 321, 309, 316; 600/422; 333/219; 356/350

(56) References Cited

U.S. PATENT DOCUMENTS 5,358,703 A * 10/1994 Lai ................................ 424/9
5,865,746 A * 2/1999 Murugesan et al. ......... 600/410
6,046,586 A * 4/2000 Rinard ......................... 324/300

OTHER PUBLICATIONS

Swartz et al., "Three–Dimensional Electron Spin Resonance Imaging," Journal of Magnetic Resonance, 84, 247, 1989, pp. 247–254.

Eaton et al., "Introduction to EPR Imaging Using Magnetic–Field Gradients," Concepts in Magnetic Resonance, 7 (1), 49–47, 1994, pp. 49–67.

Eaton et al., "Three–Dimensional EPR Imaging with One Spectral and Two Spatial Dimensions," Chemical Physics Letters, vol. 142, No. 6, 1987, pp. 567–569.

Symons et al.,"A Radiofrequency EST Spectrometer for in Vivo Imaging," Joural of Magnetic Resonance, 92, 480, 1991, pp. 480–489.

* cited by examiner

Primary Examiner—Edward Lefkowitz
Assistant Examiner—Brij B. Shrivastav
(74) Attorney, Agent, or Firm—Venable; Ann S. Hobbs (57) ABSTRACT

A device is described which permits the acquisition of Electron Paramagnetic Resonance Images without employing additional hardware for generation of magnetic field gradients. It employs the inherent gradient in the modulation field, operating with high amplitude modulator.

10 Claims, 8 Drawing Sheets

ELECTRONIC PARAMAGNETIC RESONANCE IMAGING DEVICE USING HIGH AMPLITUDE MODULATOR

FIELD OF INVENTION

The present invention relates to a device for Electron Paramagnetic Resonance Imaging using a high amplitude modulator. More particularly, the present invention relates to a device for one-, two- or three-dimensional Electron Paramagnetic Resonance (EPR) Imaging by employing a technique of radiofrequency or microwave spectroscopy that detects and measures the spatial distribution of free radicals, certain transition metal complexes, certain rare earth metal complexes, triplet state molecules and the like, by virtue of the presence of unpaired electrons in such species. It has potential application in leather industry for detecting the presence and distribution of chromium in leather. It may also be used in the drugs, pharmaceuticals and cosmetics industry. The device is also envisaged to have use for detecting the presence and distribution of radicals including the nitroxide radical in metabolites for medical purpose. Further, it has potential use in mineralogical applications and also in foodstuffs industry.

BACKGROUND OF INVENTION

Electron Paramagnetic Resonance, which is also known as Electron Spin Resonance (ESR), is one of the spectroscopic tools to study the molecular structure of organic free radicals and inorganic complexes. The measurement is performed by locating the sample of interest (usually liquid or solid) in a suitable resonator (e.g. cavity, slow wave structure, etc.) placed in a spatially homogeneous magnetic field and irradiating it with electromagnetic (em) radiation whose frequency matches the characteristic precession frequency of the electron spins in the external field. The resonance frequency is given by the following equation $$\omega_0 = \frac{g\beta}{\hbar} B_0$$

where g is the spectroscopic splitting factor (Landé factor, or simply the g-factor), $\beta$ is the Bohr magneton, $B_0$ is the intensity of the magnetic field and $\hbar$ is Planck's constant divided by $2\pi$.

This 'first order' equation for the resonance frequency is usually modified by additional factors involving internal (or local) fields from other unpaired electrons and/or nuclear spins. The resonant absorption or emission of em radiation under these conditions is customarily recorded by varying the intensity of the external magnetic field across the resonance condition, holding the frequency of the em radiation constant in continuous wave (cw) mode. In order to minimize direct current (dc) drifts during the course of the field scan and to improve signal-to-noise ratio, it is customary to employ field modulation, typically at 100 Hz to 100 kHz, employing a set of modulation coils mounted in the resonator/cavity and perform phase sensitive detection (PSD) of the output of the em detector (e.g. Diode detector). Normally, EPR measurements are employed to access detailed information about the electronic structure, shape and dynamics of molecular species, the sample and magnetic field being made as spatially homogeneous as possible.

This prompted researchers to study molecular distributions as well as molecular structure in inhomogeneous systems by employing the imaging technique, where the information is accessed by locating the object of interest in a suitable resonator in a magnetic field that has spatial variation, i.e. gradients. Under these conditions, the resonance frequency is given by the following equation $$\omega_0 = \frac{g\beta}{\hbar}(B_0 + G \cdot r)$$

where G indicates gradient vector, while r indicates the position vector in the sample.

The resolution of an EPR image is dependent on a number of parameters, including the intensity of the magnetic field gradient, the intrinsic width of the basic EPR resonance of the species in question (the 'linewidth'), the signal-to-noise ratio per volume element of the sample, molecular diffusion processes, etc. In general, the EPR linewidth is of the order of several Gauss (1 Gauss $\Box 10^{-4}$ Tesla), or several Megahertz in frequency units. The resolution R expected on the basis of the first two parameters may be given as:

$$R = \frac{\Delta v_{1/2}}{G}$$

Here, $\Delta v_{1/2}$ denotes the linewidth, while G denotes the gradient amplitude. As reported by Swartz et al (Journal of Magnetic Resonance, 84, 247, 1989), Eaton et al ("EPR Imaging and in vivo EPR," CRC Press, Boston, 1991), Eaton et al (Concepts in Magnetic Resonance, 7, 49, 1994), Eaton et al (Chemical Physics Letters, 142, 567, 1987) and Symons et al. (Journal of Magnetic Resonance, 92, 480, 1991), EPR imaging has conventionally been carried out by continuous wave (CW) method using a standard EPR spectrometer, where the frequency of radiation is held constant, while the magnetic field is swept. Depending on the nature of experiment, gradient currents are turned on to do 1-Dimensional, 2-Dimensional or 3-Dimensional EPR imaging or spectral-spatial work.

It is customary to generate the gradient(s) by additional sets of anti-Helmholtz or Anderson coils located in the main magnetic field. When currents are passed through such water- or forced air-cooled coils, sizeable gradients may be generated, with amplitude upto about 1 Tesla $m^{-1}$ (100 Gauss $cm^{-1}$). One set of coils is typically employed for each of the. three orthogonal directions in space. Because the inverse of the EPR linewidth is typically short compared to gradient switching times, it is customary to acquire the signal in the presence of the gradient, then reorient the sample with respect to the gradient (e.g. by rotating the gradient, adjusting the current amplitudes in two sets of gradient coils) to obtain a two-dimensional image. Projection reconstruction of the resulting series of profiles, including suitable shift, deconvolution and back projection operations then yields the desired image.

OBJECTIVES OF THE INVENTION

The main objective of the present invention is to provide a device for Electron Paramagnetic Resonance Imaging, which obviates the special requirements and limitations stated above.

Another objective of the present invention is to generate the desired EPR images, without employing additional sets of gradient coils.

Yet another objective of the present invention is to operate the field modulation at a high amplitude typically more than 20 Gauss, in the range of 14–78 Gauss in the present system.

Still another objective of the present invention is to exploit the intrinsic inhomogeneity or gradient in the modulation field to generate the desired information.

One more objective of the present invention is to provide a device for imaging using high amplitude modulator with its intrinsic gradient, on existing cw EPR spectrometer/imaging systems.

Yet one another objective of the present invention is to provide an option to rotate the sample in the resonator.

SUMMARY OF THE INVENTION

The novelty and non-obviousness of the present invention lies in using a high amplitude modulator (16) enabling large field modulation amplitudes, typically at least 20 Gauss, to exploit the inherent gradient of the field modulation, thereby avoiding use of additional sets of gradient coils to generate two or three dimensional EPR images, whereby the additional expenditure for providing gradient coils, gradient amplifiers and the associated cooling system, as is essential in case of conventional EPR imaging systems, can be avoided.

BRIEF DESCRIPTION OF THE ACCOMPANYING DRAWINGS

In the drawings accompanying this specification.

Figure 1:
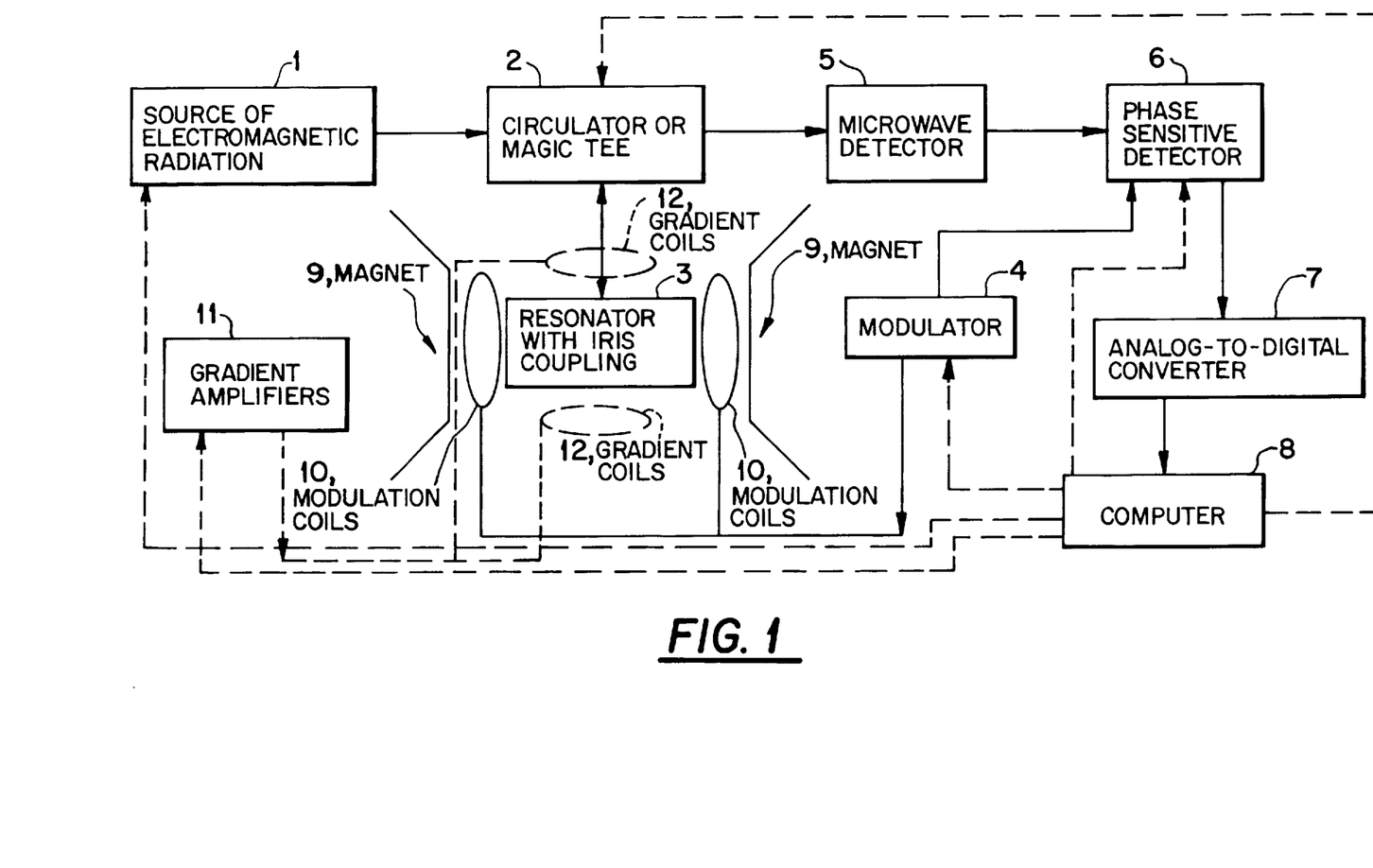
FIG. 1 represents a schematic block diagram of typical EPR (ESR) spectrometer, including one set of gradient coils driven by a gradient amplifier, used for conventional EPR imaging.
Figure 2:
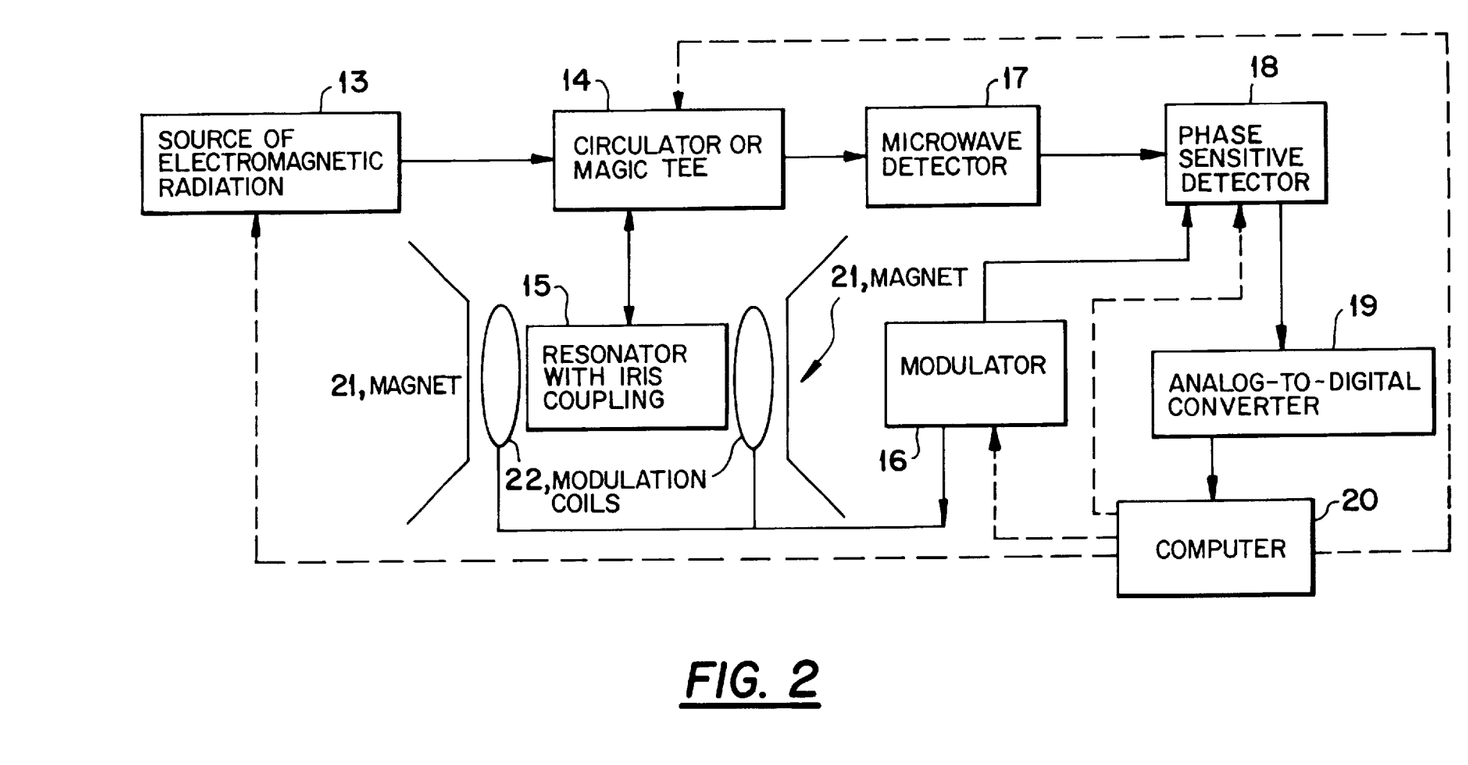
FIG. 2 represents a schematic block diagram of the device of the present invention for EPR imaging.

Different components of FIG. 1 are as follows:
1. refers to source of electromagnetic radiation in the microwave or rf region
2. refers to Circulator or Magic Tee
3. refers to resonator incorporating an iris coupling
4. refers to modulator
5. refers to microwave detector, e.g. diode detector
6. refers to phase sensitive detector (PSD)
7. refers to analog-to-digital converter (ADC)
8. refers to Computer
9. refers to Magnet with North and South poles
10. refers to modulation coils
11. refers to gradient amplifiers
12. refers to gradient coils Different components of FIG. 2 are as follows:
13. refers to source of electromagnetic radiation in the microwave or rf region
14. refers to Circulator or Magic Tee
15. refers to resonator incorporating an iris coupling
16. refers to high amplitude modulator, capable of producing modulation amplitude in the range of 14–78 Gauss cm$^{-1}$
17. refers to microwave detector, e.g. diode detector
18. refers to phase sensitive detector (PSD)
19. refers to analog-to-digital converter (ADC)
20. refers to Computer
21. refers to Magnet with North and South poles
22. refers to Modulation coils

DETAILED DESCRIPTION OF THE INVENTION

The working of the device of the present invention is described below in detail.

The sample under investigation is placed inside a conventional resonator (15) and oriented externally with the help of a goniometer (not shown in the drawing). The resonator (15) is then tuned and matched with the frequency source (13) and the field modulation is set at an amplitude typically of at least 20 Gauss. EPR spectral profile of the sample is then recorded by conventional field sweep method. Varying the modulation frequency may optimize the profile. The same process is repeated to get a minimum of 12 profiles, each with a different orientation of the sample. These profiles are then processed by conventional method of projection reconstruction including shift, deconvolution and back projection to generate the desired two or three dimensional images.

The present invention provides a device for Electron Paramagnetic Resonance Imaging, comprises a microwave bridge consisting of a source of electromagnetic radiation (13) in the microwave region, and attenuation and phase shift elements, the output of the said source (13) is connected to one arm of a Circulator or Magic Tee (14), another arm of which is coupled to a resonator (15) through an iris coupling, and the third arm being connected to a microwave detector, e.g. diode detector (17), the output of which is connected to one input of a phase sensitive detector (PSD) (18), and the second input of the said PSD is connected to one output of a high amplitude modulator (16), capable of producing large field modulation amplitudes, of at least 20 Gauss, the second output of the said modulator (16) is fed to the modulation coils (22) associated with the resonator (15), the output of the PSD (18) being fed to an analog-to-digital converter (ADC) (19), whose output is connected to a Computer (20), the resonator (15) being placed in the center of the magnetic field between the North pole and South pole of a magnet (21).

In an embodiment of the present invention, the source of electromagnetic radiation used may be such as klystron, Gunn diode oscillator, or Impact Avalanche and Transit Time (IMPATT) diode.

In another embodiment of the present invention, the microwave detector used is a diode detector.

In yet another embodiment of the present invention, the resonator used may be such as slow wave helical structure, dielectric resonator, cylindrical resonator, rectangular resonator or slotted resonator.

In still another embodiment of the present invention, the means of orienting the sample may be such as manually settable or computer controlled goniometer.

In one more embodiment of the present invention, the reorientation of the sample may be such as to vary polar angle or azimuth angle of the sample with respect to the field.

In yet one more embodiment of the present invention, the minimum number of EPR profiles to be taken for generating the image may be 12.

The following examples are given by way of illustration only and therefore should not be construed to limit the scope of the present invention.

EXAMPLE 1

Figure 3:
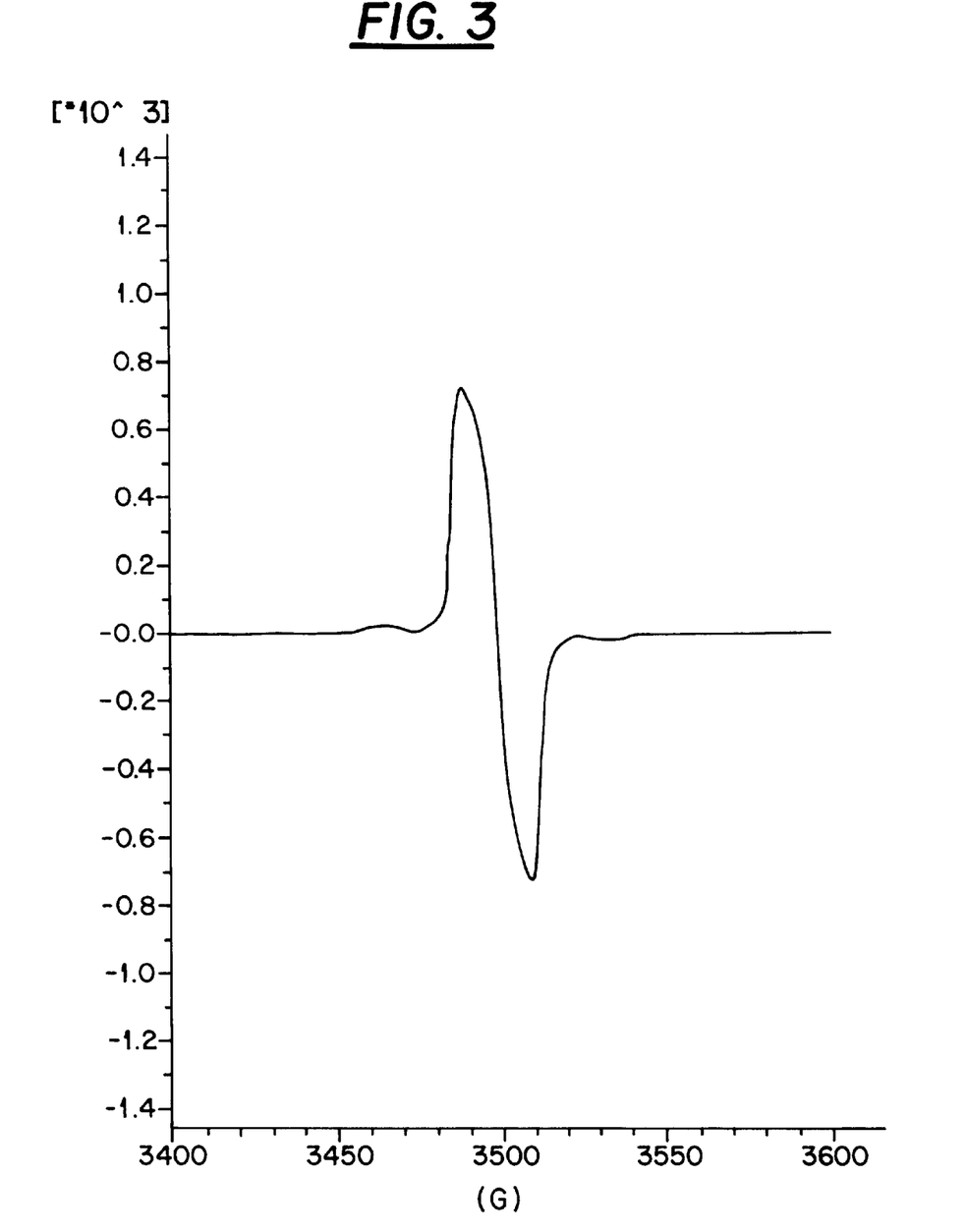
FIG. 3 represents an x-profile of Cr(V) hmba, as per details in Example 1
Figure 4:
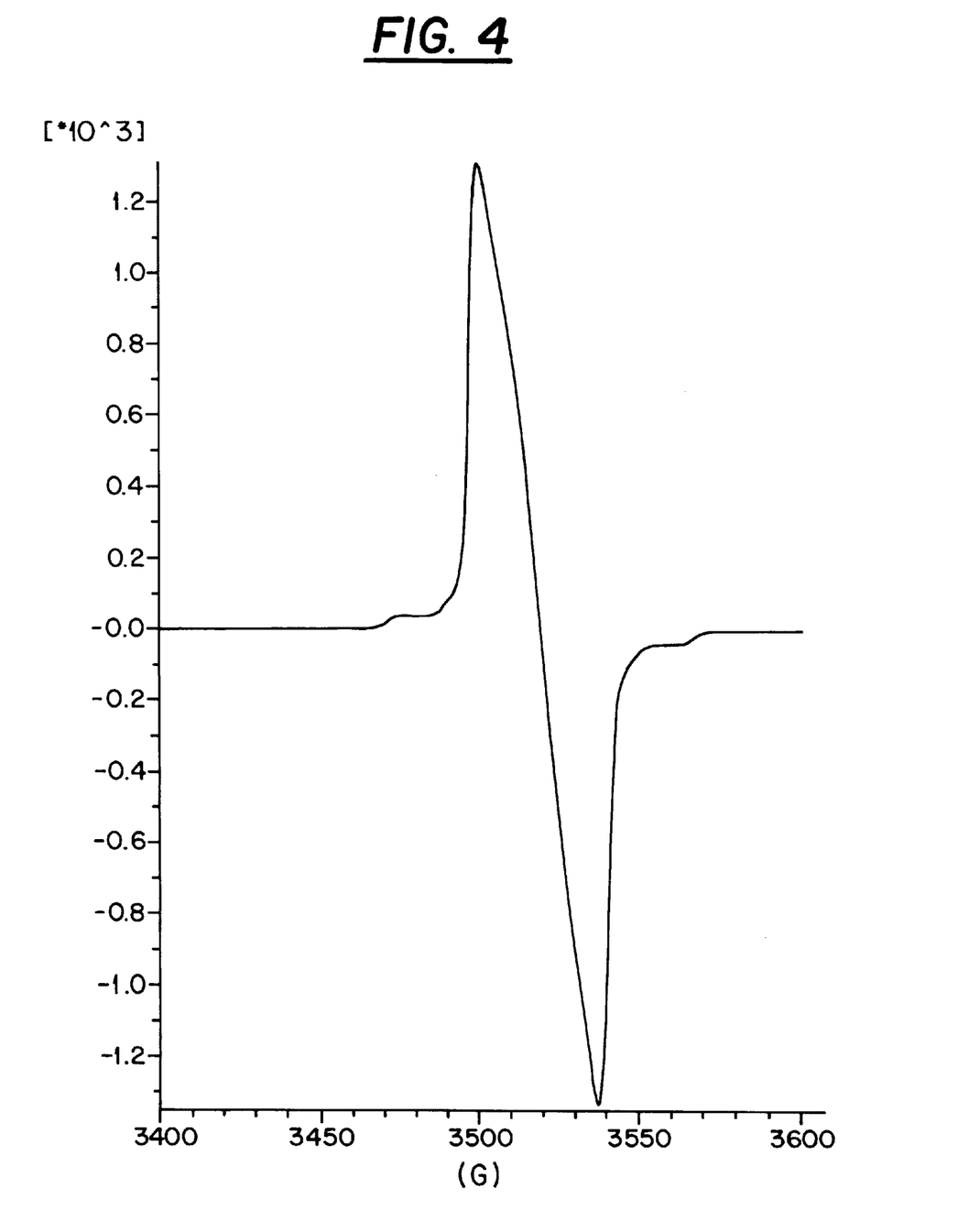
FIG. 4 represents a y-profile of Cr(V) hmba, as per details in Example 1

0.25 ml of Cr(V) hmba (hmba: 2-hydroxy-2-methylbutyric acid) solution was taken in two capillary tubes of diameter 2 mm, two empty tubes of diameter 3 mm were interposed between the said 2 mm tubes, and the entire sample was placed in the standard rectangular $TE_{102}$ cavity resonator of a Bruker EMX 10/2.7 EPR spectrometer parallel to the magnetic field direction z, the field modulation being set to a frequency of 100 kHz and an amplitude of 32.18 Gauss, the maximum legal setting on this system. The profile of the sample was obtained. The sample was then reoriented using a manual goniometer to 15° from the z-axis and the process was repeated. In a similar way, the process was repeated 12 times by subjecting the sample to a reorientation of 15° each time, thereby getting 12 profiles. The profiles are processable using IDL software to get 2-dimensional image of the sample, in conformity with the morphology of the phantom object. FIG. 3 and FIG. 4 represent typical x- and z-profiles, respectively. The x-profile refers to the sample oriented along the x direction, where all tubes have the same z co-ordinate, but different x co-ordinates, the axes of the tubes being parallel to each other and to y; the x direction is perpendicular to the magnetic field direction z and lies in the horizontal plane. The z-profile refers to the sample oriented along the z direction, where all tubes have the same x co-ordinate, but different z co-ordinates, the axes of the tubes being parallel to each other and to y.

EXAMPLE 2

Figure 5:
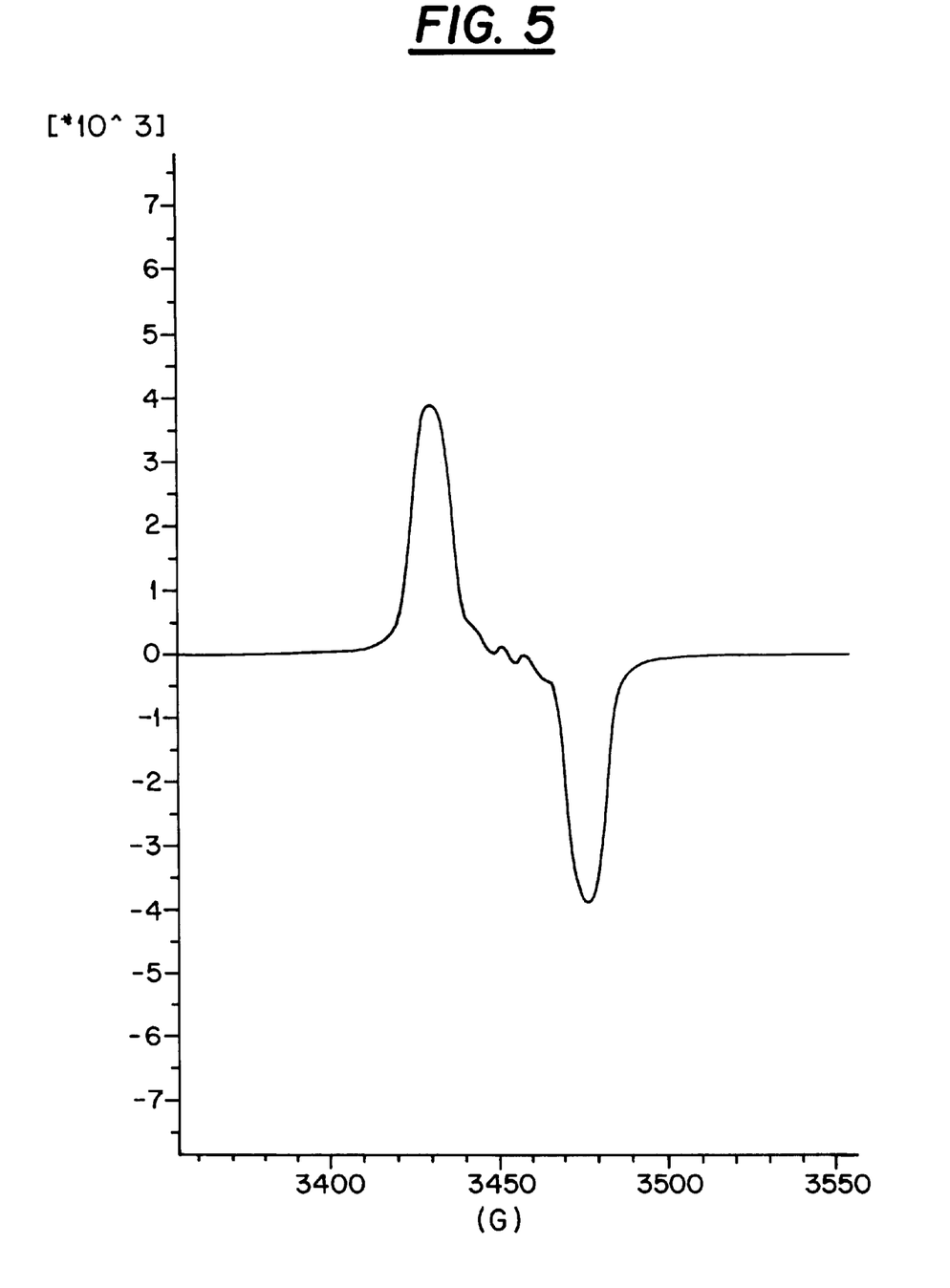
FIG. 5 represents an x-profile of 4-hydroxy-TEMPO, as per details in Example 2
Figure 6:
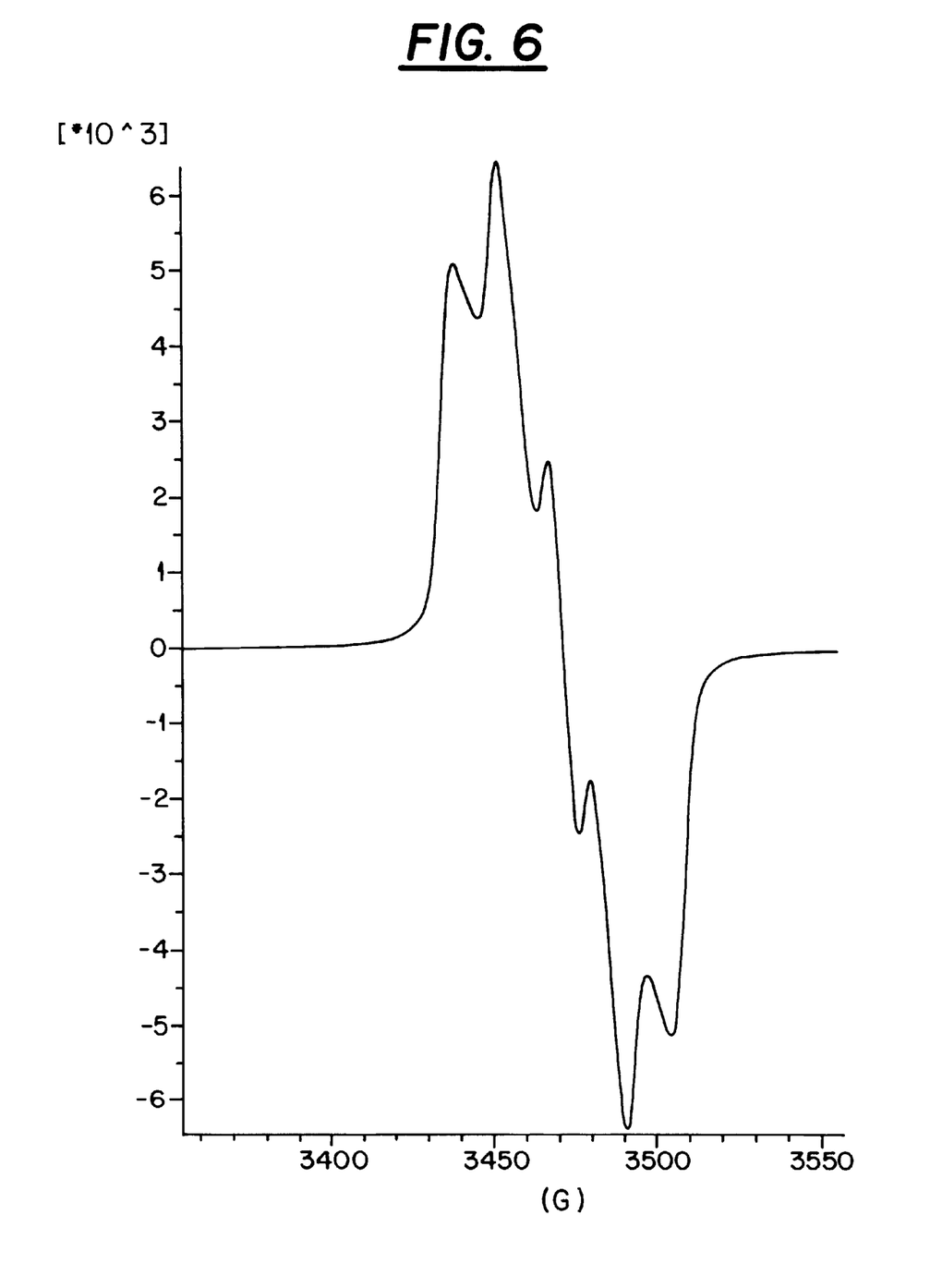
FIG. 6 represents a y-profile of 4-hydroxy-TEMPPO, as per details in Example 2

0.25 ml of a solution of 4-hydroxy-TEMPO (TEMPO: 2,2,6,6-tetramethyl piperidine-1-oxyl radical) was taken in two short capillary tubes of diameter 2 mm, two empty short tubes of diameter 3 mm were interposed between the said 2 mm tubes, and the entire sample was placed in a dielectric resonator connected to a Bruker EMX 10/2.7 EPR spectrometer parallel to the magnetic field direction z, the field modulation being set to a frequency of 100 kHz and an amplitude of 32.18 G. The profile of the sample was obtained. The sample was then reoriented using a manual goniometer to 10° from the z-axis and the process was repeated. In a similar way, the process was repeated 18 times by subjecting the sample to a reorientation of 10° each time, thereby getting 18 profiles. The profiles are processable using IDL software to get 3-dimensional image of the sample, in conformity with the morphology of the phantom object, after orthogonal mounting of the phantom followed by a similar rotation procedure as before. FIG. 5 and FIG. 6 represent typical x- and z-profiles, respectively.

EXAMPLE 3

Figure 7:
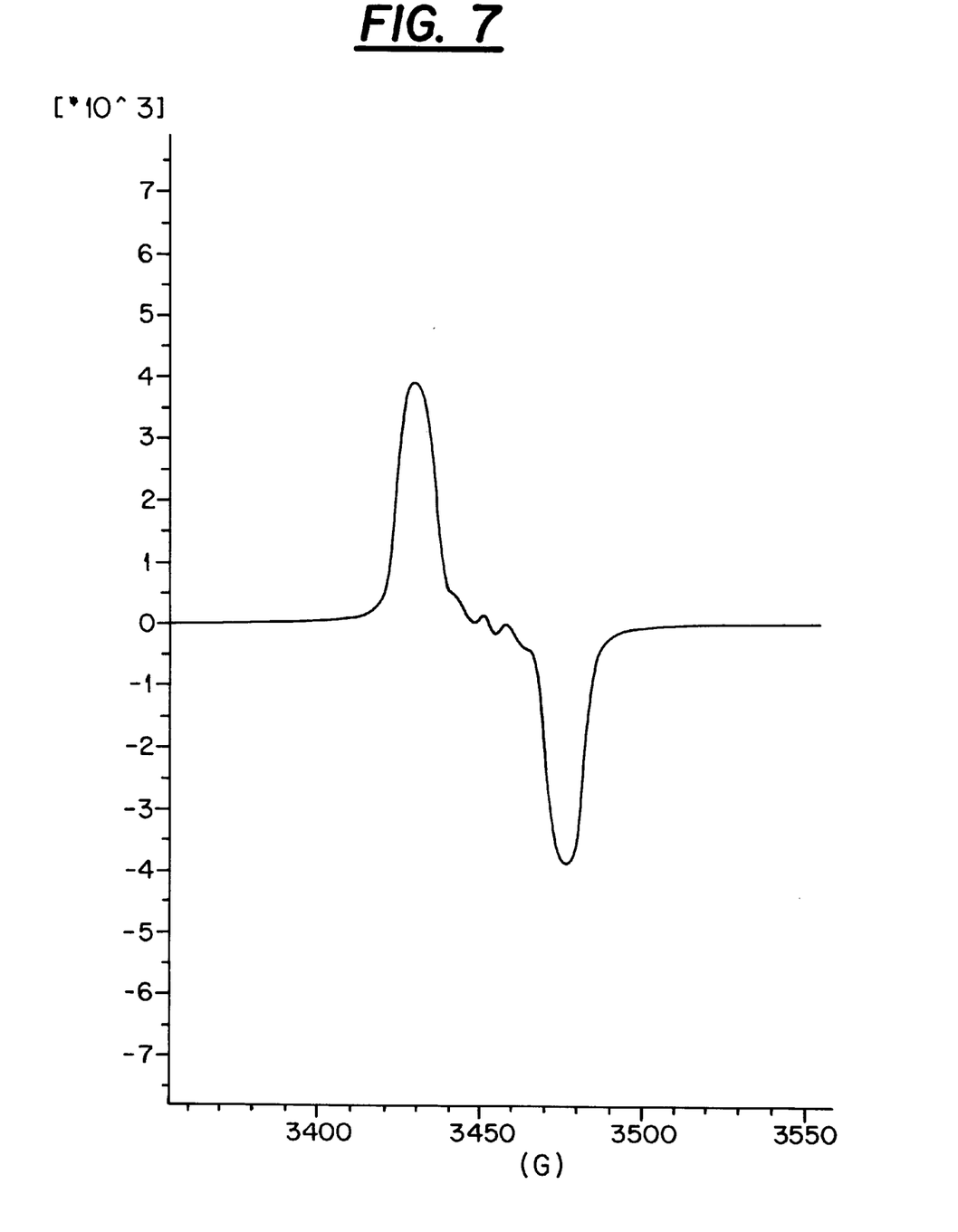
FIG. 7 represents an x-profile of 4-hydroxy-TEMPO, as per details in Example 3
Figure 8:
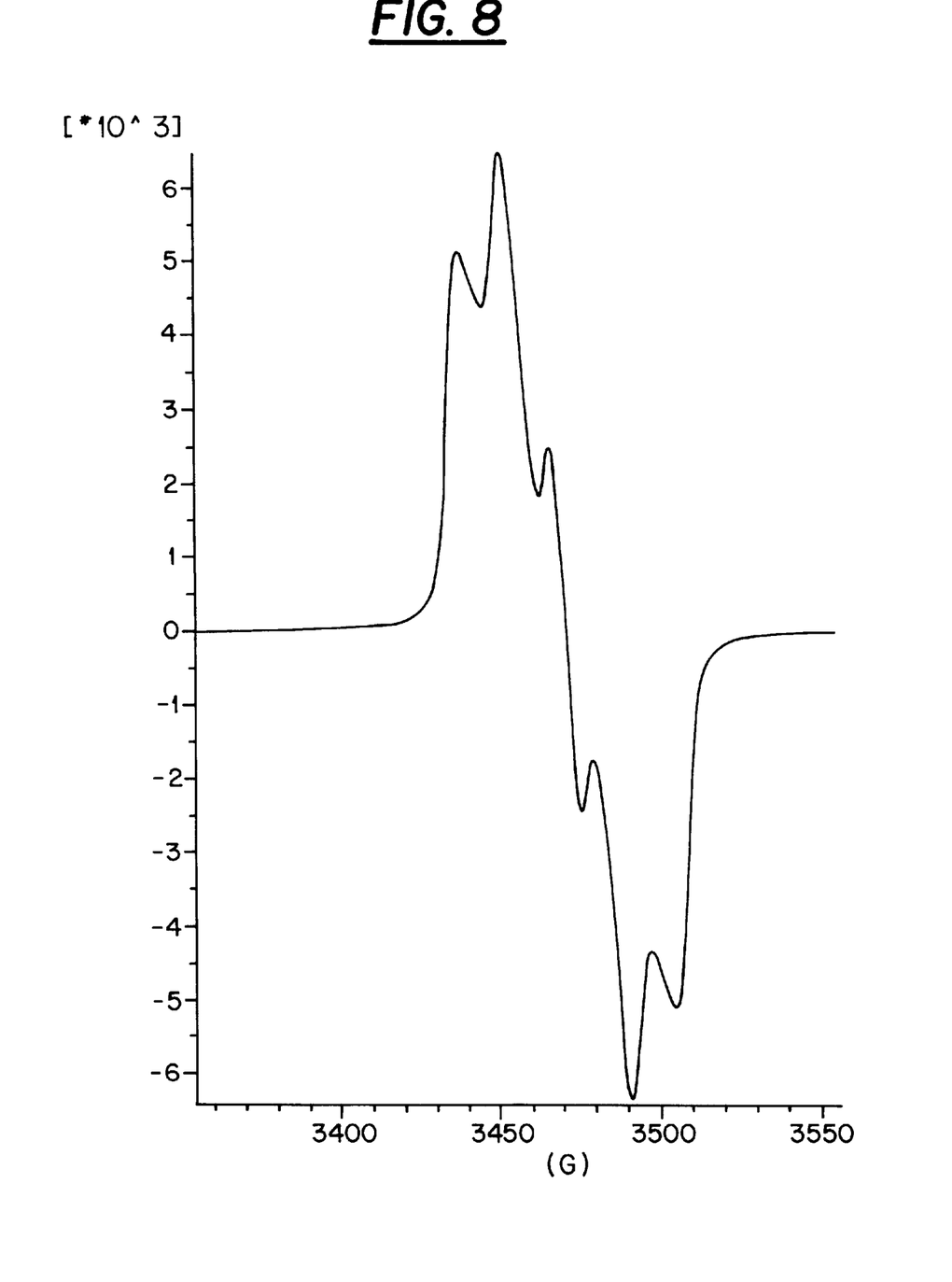
FIG. 8 represents a y-profile of 4-hydroxy-TEMPO, as per details in Example 3

0.25 ml of a solution of 4-hydroxy-TEMPO was taken in two capillary tubes of diameter 2 mm, two empty tubes of diameter 3 mm were interposed between the said 2 mm tubes, and the entire sample was placed in a cylindrical resonator connected to a Bruker EMX 10/2.7 EPR spectrometer parallel to the magnetic field direction z, the field modulation being set to a frequency of 100 kHz and an amplitude of 32.18 G. The profile of the sample was obtained. The sample was then reoriented using a manual goniometer to 10° from the z-axis and the process was repeated. In a similar way, the process was repeated 18 times by subjecting the sample to a reorientation of 10° each time, thereby getting 18 profiles. The profiles are processable using IDL software to get 2-dimensional image of the sample, in conformity with the morphology of the phantom object. FIG. 7 and FIG. 8 represent typical x- and z-profiles, respectively.

The Main Advantages of the Present Invention are the Following

1. It is a much simpler process for EPR imaging of paramagnetic substances.
2. The device of the present invention generates one, two- or three-dimensional EPR images, without employing additional sets of gradient coils.
3. No arrangement is required for cooling, unlike the conventional system of EPR imaging with gradient coils.
4. It generates one, two- or three-dimensional EPR images, without employing additional sets of gradient amplifiers.
5. Since the modulation coils are typically located in the walls of the resonator they are more proximal to the sample and can generate larger modulation fields—and gradients—at the sample per unit current than is the case with external gradient coils, which are mounted outside the resonator.
6. The present invention provides a device for imaging using high amplitude modulator with its intrinsic gradient, on existing cw EPR spectrometer/imaging systems.

What is claimed is:

1. A device for Electron Paramagnetic Resonance Imaging characterized by using a high amplitude modulator wherein the said device comprises a microwave bridge consisting of a source of electromagnetic radiation (13) in the microwave region, and attenuation and phase shift elements, the output of the said source (13) is connected to one arm of a Circulator or Magic Tee (14), another arm of which is coupled to a resonator (15) through an iris coupling, and the third arm being connected to a microwave detector, (17), the output of which is connected to one input of a phase sensitive detector (PSD) (18), and the second input of the said PSD is connected to one output of a high amplitude modulator (16), capable of producing large field modulation amplitudes, of at least 20 Gauss, the second output of the said modulator (16) is fed to the modulation coils (22) adaptable to produce large field modulation amplitudes and associated with the resonator (15), the output of the PSD (18) being fed to an analog-to-digital converter (ADC) (19), whose output is connected to a Computer (20), the resonator (15) being placed at the center of the magnetic field between the North pole and South pole of a magnet (21).

2. A device as claimed in claim 1, wherein the source of electromagnetic radiation used is selected from the group consisting of klystron, Gunn diode oscillator and Impact Avalanche and Transit Time (IMPATT) diode.

3. A device as claimed in claim 1, wherein the microwave detector is a diode detector.

4. A device as claimed in claim 1, wherein the field modulations are operated at high amplitudes ranging between 14–78 gauss.

5. A device as claimed in claim 1, wherein the resonator used is selected from the group consisting of slow wave helical structure, dielectric resonator, cylindrical resonator, rectangular resonator and slotted resonator.

6. A device as claimed in claim 1, wherein the means of orienting the sample comprises manually settable or computer controlled goniometer.

7. A device as claimed in claim 1, wherein the reorientation of the sample is carried out to vary polar angle or azimuth angle of the sample with respect to the magnetic field.

8. A device as claimed in claim 1, wherein the Electron Paramagnetic Resonance Imaging is done without using gradient coils.

9. A device as claimed in claim 1, wherein the Electron Paramagnetic Resonance Imaging is done without using gradient amplifiers.

10. A device as claimed in claim 1, wherein the Electron Paramagnetic Resonance Imaging is done without using the cooling system associated with the gradient coil.

* * * * *